(12) United States Patent
Goto

(10) Patent No.: US 6,960,422 B2
(45) Date of Patent: *Nov. 1, 2005

(54) PLANOGRAPHIC PRINTING PLATE PRECURSOR

(75) Inventor: Takahiro Goto, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/454,608

(22) Filed: Jun. 5, 2003

(65) Prior Publication Data

US 2003/0232280 A1 Dec. 18, 2003

(30) Foreign Application Priority Data

Jun. 5, 2002 (JP) .............................. 2002-164700

(51) Int. Cl.⁷ .............................................. G03F 7/038
(52) U.S. Cl. .............................. 430/281.1; 430/283.1; 430/284.1; 430/286.1; 430/287.1; 430/288.1
(58) Field of Search ........................ 430/281.1, 283.1, 430/284.1, 286.1, 287.1, 288.1, 157

(56) References Cited

U.S. PATENT DOCUMENTS

| | | | | |
|---|---|---|---|---|
| 4,710,445 A | * | 12/1987 | Sanders | 430/252 |
| 6,083,658 A | * | 7/2000 | Kunita et al. | 430/270.1 |
| 6,309,792 B1 | * | 10/2001 | Hauck et al. | 430/270.1 |
| 6,410,208 B1 | * | 6/2002 | Teng | 430/302 |
| 6,566,035 B1 | * | 5/2003 | Aoshima | 430/270.1 |
| 6,660,446 B2 | * | 12/2003 | Shimada et al. | 430/270.1 |
| 6,692,896 B2 | * | 2/2004 | Shimada et al. | 430/281.1 |
| 2003/0215745 A1 | * | 11/2003 | Fujimaki | 430/280.1 |
| 2004/0009426 A1 | * | 1/2004 | Goto et al. | 430/270.1 |

FOREIGN PATENT DOCUMENTS

| | | | |
|---|---|---|---|
| EP | 1 091 247 A2 | 4/2001 | |
| EP | 1 096 315 A1 | 5/2001 | |
| EP | 1 110 747 A1 | 6/2001 | |
| EP | 1160095 A2 | * 12/2001 | ............ B41M/5/36 |
| EP | 1 162 078 A2 | 12/2001 | |
| EP | 1 176 007 A2 | 1/2002 | |
| EP | 1 182 032 S2 | 2/2002 | |
| EP | 1 182 032 A2 | 2/2002 | |
| EP | 1 182 033 A1 | 2/2002 | |
| EP | 1 186 407 A1 | 3/2002 | |
| EP | 1 211 096 A1 | 6/2002 | |
| EP | 1 285 749 A2 | 2/2003 | |
| EP | 1 285 751 A2 | 2/2003 | |
| EP | 1 291 718 A2 | 3/2003 | |
| EP | 1 332 870 A2 | 8/2003 | |
| EP | 1 334 824 A2 | 8/2003 | |
| EP | 1 341 040 A1 | 9/2003 | |
| JP | 6-1088 A | 1/1994 | |
| JP | 6-1088 | 1/1994 | |
| JP | 8-108621 | 4/1996 | |
| JP | 9-34110 | 2/1997 | |
| JP | 9-43845 A | 2/1997 | |
| JP | 9-43845 | 2/1997 | |
| JP | 9-43847 | 2/1997 | |
| JP | 9-43847 A | 2/1997 | |

* cited by examiner

*Primary Examiner*—Barbara L. Gilliam
(74) *Attorney, Agent, or Firm*—Sughrue Mion, PLLC

(57) ABSTRACT

The present invention discloses a negative planographic printing plate precursor for infrared exposure having an image recording layer containing an infrared absorbing agent, a radical generator and a radical polymerizable compound on a support characterized in that a sensitivity ratio $(S^1/S^{60})$ of a sensitivity $(S^{60})$ when developed 60 minutes after infrared laser exposure to a sensitivity $(S^1)$ when developed one minute after exposure is at least 0.5 and less than 1.0 in the image recording layer. It is preferable that this composition contains a polymer compound which has a functional group having high radical reactivity and can be dissolved or swollen in water or an aqueous alkali solution.

9 Claims, No Drawings

PLANOGRAPHIC PRINTING PLATE PRECURSOR

CROSS-REFERENCE TO RELATED APPLICATIONS

This application claims benefit of and priority to Japanese Patent Application No. 2002-164700, filed on Jun. 5, 2002, which is incorporated herein by reference in its entirety for all purposes.

BACKGROUND OF THE INVENTION

1. Field of Invention

The present invention relates to a negative planographic printing plate precursor for infrared exposure having a photopolymerizable image recording layer which can be cured by infrared exposure.

2. Description of the Related Art

Conventionally, various systems have been developed for direct plate making from digital data of a computer. For example, since photopolymerization system image recording materials that are exposed using lasers, which emit blue or green visible light, are sensitive to an argon laser and the like, and make possible direct plate-making utilizing a photopolymerization initiating system with high sensitivity, such recording materials are being paid attention as recording layers for planographic printing plate which can attain high printing endurance due to a toughness of a coated film cured by photopolymerization.

For example, as a laser printing plate utilizing a photopolymerization initiating system, which is sensitive to visible lasers, such as argon lasers and the like, there is used a laser printing plate obtained by providing a photopolymerizable composition layer comprising a compound containing an addition polymerizable ethylenic double bond and a photopolymerization initiator, and optionally comprising, an organic polymer binder, a photopolymerization inhibitor and the like on an aluminium plate, which acts as a support, and providing on the photopolymerizable composition layer an oxygen intercepting layer, which inhibits polymerization. These photopolymerizable planographic printing plates provide an image by exposing a desired image to polymerize-cure an exposed portion, and removing (developing) an unexposed portion with an aqueous alkali solution.

Recently, development of lasers has been remarkable, and high output and compact solid lasers and semiconductor lasers, which radiate an infrared-ray having a wavelength of 760 nm to 1200 nm, in particular, are easily available. These lasers are very useful as a recording light source when direct plate-making from digital data, from a computer or the like. Therefore, in addition to the above-mentioned numerous and useful photosensitive recording materials, which are sensitive to a visible light region of 760 nm or shorter, materials on which recording can be performed with these infrared lasers are being developed.

As a material which is selectively sensitive to infrared light, positive image recording materials and negative image recording materials are known. A positive image recording material that utilizes a phase change of a novolak resin is disclosed in Japanese Patent Application Laid-Open (JP-A) No. 9-43847. However, such positive image recording material has poor scarring (scratching) resistance, and there is a problem regarding handling properties thereof. On the other hand, as a negative image recording material which is excellent in scarring resistance, a material requiring no pre-heating is disclosed in JP-A Nos. 6-1088, 9-43845 and the like. However, there is a problem that such materials are inferior in image quality, in particular, in dot-reproducing properties.

In addition to make these planographic printing plate precursors, there are cases of using an image forming apparatus for supplying a plate material, and continuously performing imagewise exposure and development processing on-line, and cases of performing image formations successively off-line using an exposing device for continuously performing imagewise exposure to a plurality of planographic printing plate precursors and a developing device for developing the exposed plate material. In particular, in the latter, there is a problem that a time elapses after exposure by plate-making, thereby, a variation is generated in the sensitivity, and an image as designed can not be obtained.

SUMMARY OF THE INVENTION

An object on the present invention is to provide a negative planographic printing plate precursor for infrared-ray exposure which is cured by an infrared laser, has an image recording layer on which recording can be performed directly from digital data such as computer and the like, and can maintain the excellent performance stability even when development is not performed immediately after exposure, and development is performed after about a few tens minutes have passed.

The present inventors studied, and as a result, found that the above-mentioned problems can be solved by controlling a variation in a sensitivity from after infrared laser exposure to development within a specific value, which resulted in completion of the invention.

The present invention provides a negative planographic printing plate precursor for infrared exposure comprising a support and an image recording layer formed on the support, wherein the image recording layer includes an infrared absorbing agent, a radical generator and a radical polymerizable compound, and a sensitivity ratio ($S^1/S^{60}$) of a sensitivity of the image recording layer upon developed 60 minutes after infrared laser exposure ($S^{60}$) and a sensitivity of the image recording layer developed one minute after exposure ($S^1$) is from 0.5 to 1.0.

It is preferable that from the viewpoint of the sensitivity stability, the image recording layer includes a photosensitive composition, and the photosensitive composition includes a polymer compound which contains at least 0.1% by mol and less than 30% by mol of at least one kind of structural units represented by the following general formulas (1), (2) and (3) and can be one of dissolved and swollen by one of water and an aqueous alkali solution.

General formula (1)

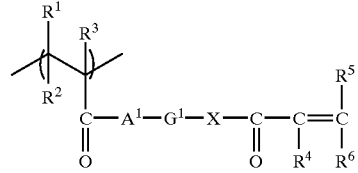

General formula (2)

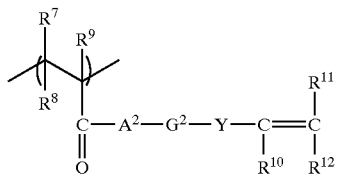

General formula (3)

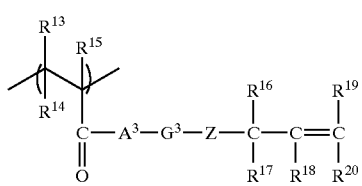

(wherein each of $A^1$, $A^2$ and $A^3$ independently represents an oxygen atom, a sulfur atom or —N($R^{21}$)—; $R^{21}$ represents a hydrogen atom or an alkyl group which may have a substituent; each of $G^1$, $G^2$ and $G^3$ independently represents a divalent organic group; each of X and Z independently represents an oxygen atom, a sulfur atom or —N($R^{22}$)—; $R^{22}$ represents an alkyl group which may have a substituent; Y represents an oxygen atom, a sulfur atom, a phenylene group which may have a substituent, or —N($R^{23}$)—; $R^{23}$ represents an alkyl group which may have a substituent; and each of $R^1$ to $R^{20}$ independently represents a hydrogen atom or a monovalent organic group.)

DETAILED DESCRIPTION OF THE PREFERRED EMBODIMENTS

The present invention will be explained in detail.

In the negative planographic printing plate precursor for infrared exposure of the invention, a sensitivity ratio ($S^1$/$S^{60}$) of a sensitivity ($S^{60}$) when an image recording layer is provided on a support by coating, infrared laser exposure is performed to form an image, and development is performed after 60 minutes have passed after exposure, and a sensitivity ($S^1$) when development is performed after one minute has passed after exposure is required to be at least 0.5 and equal to or less than 1.0, and it is preferable that ($S^1$/$S^{60}$) is at least 0.8 and equal to or less than 1.0.

In the invention, a sensitivity (S) refers to an exposure amount exhibiting the concentration of 0.8 in a property curve of image concentration vs exposure amount on a plate. For example, a property curve can be made by performing exposure by changing an exposure amount by output of an exposure apparatus such as a plate setter, performing development processing, measuring the image concentration, and plotting the dependency of the image concentration on an exposure amount. As the image concentration, a value normalized using the maximum concentration of 1 is used. Usually, when a photosensitive composition is used in an image recording layer of a planographic printing plate precursor, since a colorant is added in order to examine an image, the image concentration can be measured directly. As the concentration, the cyan concentration was measured employing a reflex densitometer (trade name: RD-918, manufactured by Macbeth) and using a red filter which was mounted on the densitometer.

A sensitivity ratio ($S^1$/$S^{60}$) after exposure in the invention refers to a ratio of a sensitivity ($S^{60}$) at 60 minutes after exposure and a sensitivity ($S^1$) at one minute after exposure. Herein, the conditions for measuring a sensitivity ($S^1$) and a sensitivity ($S^{60}$) from which a sensitivity ratio ($S^1$/$S^{60}$) is obtained require from the viewpoint of strictly complying with the object that the conditions except that a time necessary by development are the same, that is, a printing plate after exposure is allowed to stand under the same temperature and humidity atmosphere. Generally, this allowing to stand is performed at a normal temperature and a normal humidity (namely, at 25° C. and 60% relative humidity).

Generally, a sensitivity ratio ($S^1$/$S^{60}$) after exposure in a photocurable composition which is used in an image recording layer of a planographic printing plate precursor is about 0.1 to 0.45.

As effective means for controlling a sensitivity ratio ($S^1$/$S^{60}$) after exposure, there are a method of prolonging a life of radicals generated by a polymerization initiator contained in a photopolymerizable compound, and a method of adding a polymer having the high reactivity to a composition. In particular, a variation in a sensitivity after exposure can be effectively suppressed by using a reactive polymer, for example, because the reactivity of a polymer is high even when a life of radicals generated from a polymerization initiator is short. As a reactive polymer, any polymers can be arbitrarily selected and used as far as they are polymers having a particular reactive functional group and, inter alia, a polymer compound which contains at least 0.1% by mol and less than 30% by mol of at least one of structural units represented by the following general formulas (1), (2) and (3), and is soluble and may be swollen in water or an aqueous alkaline solution is preferable:

General formula (1)

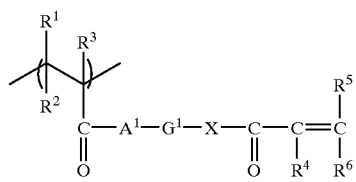

General formula (2)

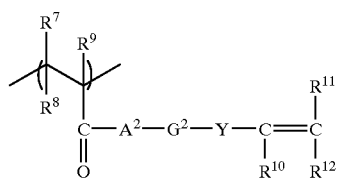

General formula (3)

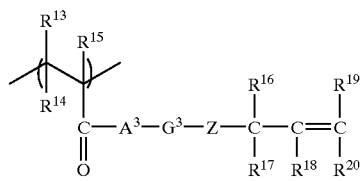

(wherein each of $A^1$, $A^2$ and $A^3$ independently represents an oxygen atom, a sulfur atom or —N($R^{21}$)—; $R^{21}$ represents a hydrogen atom or an alkyl group which may have a substituent; each of $G^1$, $G^2$ and $G^3$ independently represents a divalent organic group; each of X and Z independently represents an oxygen atom, a sulfur atom or —N($R^{22}$)—; $R^{22}$ represents an alkyl group which may have a substituent; Y represents an oxygen atom, a sulfur atom, a phenylene group which may have a substituent, or —N($R^{23}$)—; $R^{23}$ represents an alkyl group which may have a substituent; and each of $R^1$ to $R^{20}$ independently represents a hydrogen atom or a monovalent organic group).

By adding to a composition such a polymer compound which has the high reactivity and functions as a binder, although an action which can suppress a variation in a sensitivity is not clear, since structural units represented by general formulas (1), (2) and (3) have a functional group having the high radical reactivity, a cross-linking reaction is caused between polymer binders rapidly after generation of radicals at infrared-ray laser scanning exposure. By inclusion of such the structural unit in a polymer composition, cured film formation, that is, insolubilization to a developer and an organic solvent is caused very rapidly. For this reason, it is presumed that, immediately after exposure, a necessary insolubilizing reaction progresses, and a cured film having the sufficient strength can be obtained and, thus, a difference between a sensitivity when developed immediately after exposure and a sensitivity when developed after allowing to stand for a while is considerably decreased.

Like this, since a variation in a sensitivity after exposure is suppressed, even when development processing after image exposure is performed off-line, a sensitivity is not reduced and, further, it is considered that there is an advantage that a film cross-linked due to the light, that is, a formed image part maintains the sufficient printing endurance.

A polymer compound which is suitably used for controlling a variation in a sensitivity in the invention is a polymer compound which contains at least 0.1% by mol and less than 30% by mol of at least one kind of structural units represented by the general formulas (1), (2) and (3) and is soluble or swollen in water or an aqueous alkali solution.

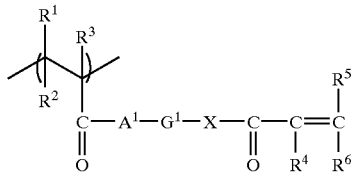

General formula (1)

In the above general formula (1), each of $R^1$ to $R^3$ independently represents a hydrogen atom or a monovalent organic group, examples thereof include a hydrogen atom and an alkyl group which may have a substituent and, inter alia, $R^1$ and $R^2$ represent preferably a hydrogen atom and $R^3$ represents preferably a hydrogen atom or a methyl group.

$R^4$ represents a hydrogen atom or a monovalent organic group, examples of $R^4$ include a hydrogen atom and an alkyl group which may have a substituent, and inter alia, a hydrogen atom, a methyl group and an ethyl group are preferable. In addition, examples of $R^5$ and $R^6$ include independently a hydrogen atom, a halogen atom, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent and, inter alia, a hydrogen atom, an alkoxycarbonyl group, an alkyl group which may have a substituent, and an aryl group which may have a substituent are preferable.

Herein, examples of a substituent which may be introduced include a methoxycarbonyl group, an ethoxycarbonyl group, an isopropioxycarbonyl group, a methyl group, an ethyl group, a phenyl group and the like.

$A^1$ and X independently represents an oxygen atom, a sulfur atom or —N($R^{21}$)—, and examples of $R^{21}$ include a hydrogen atom, and an alkyl group which may have a substituent.

$G^1$ represents a divalent organic group, and an alkyl group which may have a substituent is preferable. More preferable are an alkyl group having from 1 to 20 carbon atoms which may have a substituent, a cycloalkyl group having from 3 to 20 carbon atoms which may have a substituent, and an aromatic group having from 6 to 20 carbon atoms which may have a substituent and, inter alia, a straight or branched alkyl group having 1 to 10 of carbon atoms which may have a substituent, a cycloalkyl group having from 3 to 10 carbon atoms which may have a substituent, and an aromatic group having from 6 to 12 carbon atoms which may have a substituent are preferable from the viewpoint of the performance such as the strength, the developing property and the like.

Herein, as a substituent in $G^1$, a group in which a hydrogen atom is bound to a hetero atom, for example, a group which dose not contain a hydroxyl group, an amino group, a thiol group or a carboxyl group is preferable. When a linking group part having such the group in which a hydrogen atom is bound to a hetero atom, and an onium salt compound as the initiator described later are used jointly, the storage stability is deteriorated.

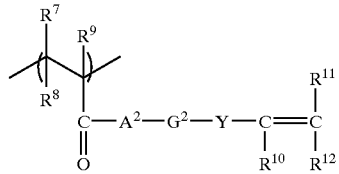

General formula (2)

In the above general formula (2), $R^7$ to $R^9$ independently represents a hydrogen atom or a monovalent organic group, examples thereof include a hydrogen atom and an alkyl group which may have a substituent and, inter alia, $R^7$ and $R^8$ represent preferably a hydrogen atom, and $R^9$ represents preferably a hydrogen atom or a methyl group.

$R^{10}$ to $R^{12}$ independently represents a hydrogen atom, a halogen atom, a sulfo group, a nitro group, a cyano group or a monovalent organic group, examples of this include a hydrogen atom, a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent and, inter alia, a hydrogen atom, an alkoxycarbonyl group, an alkyl group which may have a substituent, and an aryl group which may have a substituent are preferable.

Herein, as a substituent which can be introduced, there can be exemplified the same substituents as those described for the general formula (1).

$A^2$ represents an oxygen atom, a sulfur atom or —N($R^{21}$)—, and examples of $R^{21}$ include a hydrogen atom, and an alkyl group which may have a substituent.

$G^2$ represents a divalent organic group, and an alkyl group which may have a substituent is preferable. Preferable are an alkyl group having from 1 to 20 carbon atoms which may have a substituent, a cycloalkyl group having from 3 to 20 carbon atoms which may have a substituent, and an aromatic group having from 6 to 20 carbon atoms which may have a substituent and, inter alia, a straight or branched alkyl group having from 1 to 10 carbon atoms which may have a substituent, a cycloalkyl group having from 3 to 10 carbon atoms which may have a substituent, and an aromatic group having from 6 to 12 carbon atoms which may have a substituent are preferable from the viewpoint of the performance such as the strength, the developing property and the like.

Herein, as a substituent in $G^2$, a group in which a hydrogen atom is bound to a hetero atom, for example, a group which dose not contain a hydroxyl group, an amino group, a thiol group or a carboxyl group is preferable. By using a linking group part having such the group in which a hydrogen atom is bound to a hetero atom, and an onium salt compound as the initiator described later jointly, the storage stability is deteriorated.

Y represents an oxygen atom, a sulfur atom, —N($R^{23}$)— or a phenylene group which may have a substituent. Herein, examples of $R^{23}$ include a hydrogen atom, and an alkyl group which may have a substituent.

General formula (3)

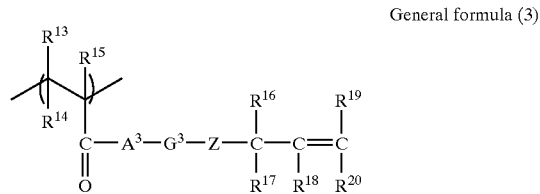

In the above general formula (3), $R^{13}$ to $R^{15}$ independently represents a hydrogen atom or a monovalent organic group, examples thereof include a hydrogen atom and an alkyl group which may have a substituent and, inter alia, $R^{13}$ and $R^{14}$ represent preferably a hydrogen atom, and $R^{15}$ represents preferably a hydrogen atom or a methyl group.

$R^{16}$ to $R^{20}$ independently represents a hydrogen atom, a halogen atom, a sulfo group, a nitro group, a cyano group or a monovalent organic group, examples of $R^{16}$ to $R^{20}$ include a hydrogen atom, a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent and, inter alia, a hydrogen atom, an alkoxycarbonyl group, an alkyl group which may have a substituent, and an aryl group which may have a substituent are preferable. As a substituent which can be introduced, there can be exemplified the same substituents as those for the general formula (1). $A^3$ and Z represent an oxygen atom, a sulfur atom or —N($R^{21}$)—. Examples of $R^{21}$ include those described for the general formula (1).

$G^3$ represents a divalent organic group, and an alkyl group which may have a substituent is preferable. Preferable are an alkyl group having from 1 to 20 carbon atoms which may have a substituent, a cycloalkyl group having from 3 to 20 carbon atoms which may have a substituent, and an aromatic group having from 6 to 20 carbon atoms which may have a substituent and, inter alia, a straight or branched alkyl group having from 1 to 10 carbon atoms which may have a substituent, a cycloalkyl group having from 3 to 10 carbon atoms which may have a substituent, and an aromatic group having from 6 to 12 carbon atoms which may have a substituent are preferable from the viewpoint of the performance such as the strength, the developing property and the like.

Herein, as a substituent in $G^2$, a group in which a hydrogen atom is bound to a hetero atom, for example, a group which dose not contain a hydroxyl group, an amino group, a thiol group or a carboxyl group is preferable. By using a linking group part having such the group in which a hydrogen atom is bound to a hetero atom, and an onium salt compound as the initiator described later jointly, the storage stability is deteriorated.

Such the polymer compound can be synthesized according to a method described in JP-A No. 2002-62648, such as a method of copolymerizing not smaller than 0.1% by mol and less than 30% by mol of one or more kinds of radical polymerizable compounds represented by the following general formula (4) and one or more kinds of other radical polymerizable compounds having no structural unit represented by the following general formula (4) by the normal radical polymerizing method, to synthesize a precursor for a desired polymer compound, removing a proton to leave L using a base, to obtain a desired polymer compound having a structure represented by the above general formula (1).

General formula (4)

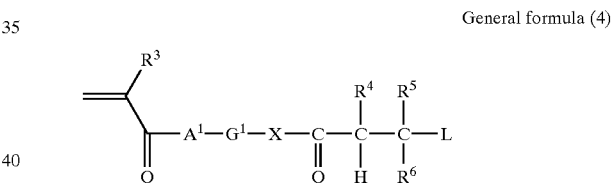

Examples of a reactive polymer compound which is suitably used in the invention are exemplified together with a weight average molecular weight, but the invention is not limited to them.

| Composition (% by mol) | | MW |
|---|---|---|
| 1 | (structure) | 97000 |

-continued
| Composition (% by mol) | MW |
|---|---|
| 2 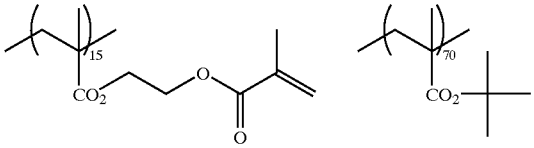  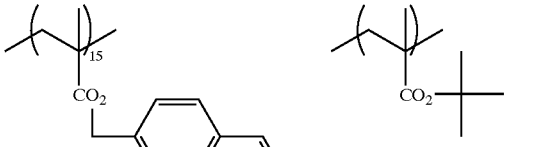 | 128000 |
| 3  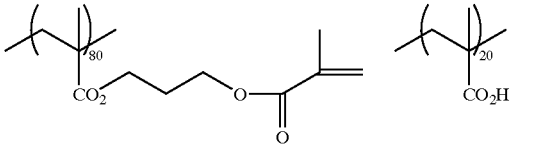  | 135000 |
| 4 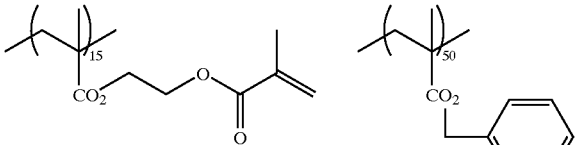 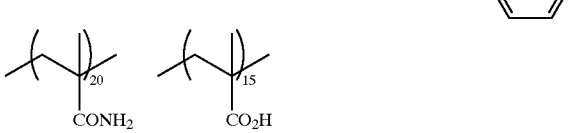 | 95000 |
| 5   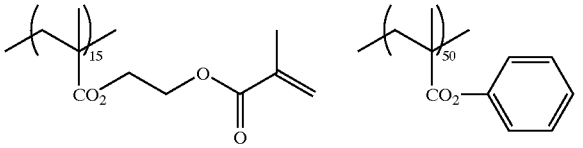 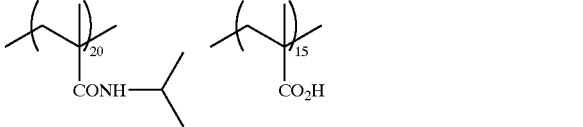 | 120000 |
| 6   | 100000 |

-continued

| Composition (% by mol) | MW |
|---|---|
| 7 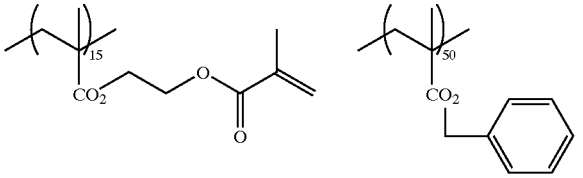 | 133000 |
| 8 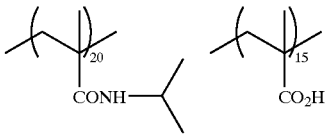 | 103000 |

Such the highly reactive polymer compound is contained in a photosensitive composition constituting an image recording layer in the invention preferably in an amount of 20 to 80% by weight of a solid content, more preferably in an amount of 40 to 70% by weight of a solid content, from the viewpoint of sensitivity controlling. When the content is too small, the sufficient sensitivity variation suppressing effect of a photosensitive composition can not be obtained.

An image recording layer in a planographic printing plate of the invention contains (A) an infrared absorbing agent, (B) a radical generator, (C) a radical polymerizable compound and, preferably in order to improve the film property, the general binder polymer except for the aforementioned polymer compound. These components will be explained successively.

(A) Infrared Absorbing Agent

An object of the invention is to make image formation possible by generating a curing reaction in a photosensitive composition constituting an image recording layer with a laser emitting infrared-ray. For doing so, it is indispensable to use an infrared absorbing agent. An infrared absorbing agent used in the invention is a dye or a pigment having an absorption maximum in a wavelength of 760 nm to 1200 nm.

As a dye, commercially available dyes and the known dyes described in a literature such as "Dye Handbook" (edited by Organic Synthesis Chemistry Society, published in 1970) can be utilized. Examples thereof include dyes such as an azo dye, a metal complex salt azo dye, a pyrazoloneazo dye, a naphthoquinone dye, an anthraquinone dye, a phthalocyanine dye, a carbonium dye, a quinoneimine dye, a methine dye, a cyanine dye, a squarylium dye, a pyrylium salt, a metal thiolate complex and the like.

As a preferable dye, there are cyanine dyes described in JP-A Nos. 58-125246, 59-84356, 59-202829 and 60-78787, methine dyes described in JP-A Nos. 58-173696, 58-181690 and 58-194595, naphthoquinone dyes described in JP-A Nos. 58-112793, 58-224793, 59-48187, 59-73996, 60-52940 and 60-63744, squarylium dyes described in JP-A No. 58-112792, and cyanine dyes described in British Patent No. 434,875.

In addition, near infrared absorption sensitizers described in U.S. Pat. No. 5,156,938 are suitably used, and substituted arylbenzo(thio)pyrylium salts described in U.S. Pat. No. 3,881,924, trimethinethiapyrylium salts described in JP-A No. 57-142645 (U.S. Pat. No. 4,327,169), pyrylium series compounds described in JP-A Nos. 58-181052, 58-220143, 59-41363, 59-84248, 59-84249, 59-146063 and 59-146061, cyanine dyes described in JP-A No. 59-216146, pentamethinethiopyrylium salts described in U.S. Pat. No. 4,283,475, and pyrylium compounds described in Japanese Patent Application Publication (JP-B) Nos. 5-13514 and 5-19702 are preferably used.

In addition, as another preferable example of a dye, there are near infrared absorbing dyes described as the formula (I) or (II) in the specification of U.S. Pat. No. 4,756,993.

Among these dyes, particularly preferable are cyanine pigments, squarylium dyes, pyrylium salts and nickel thiolate complexes. Further, cyanine pigments are preferable and, in particular, cyanine pigments represented by the following formula (a) are most preferable.

General formula (a)

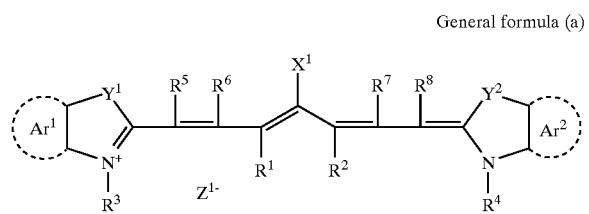

In the above general formula (a), $X^1$ represents a halogen atom, —$NPh_2$, $X^2$-$L^1$ or a group described below. Herein, $X^2$ represents an oxygen atom, a nitrogen atom or a sulfur atom, and $L^1$ represents a hydrocarbon group having from 1 to 12 carbon atoms, an aromatic ring having a hetero atom, or a hydrocarbon group having from 1 to 12 carbon atoms containing hetero atom. Herein, a hetero atom denotes N, S, O, a halogen atom or Se. $X_a^-$ is defined as in $Z_a^-$ described below, and $R^a$ represents a substituent selected from a hydrogen atom, an alkyl group, an aryl group, a substituted or unsubstituted amino group, and a halogen atom.

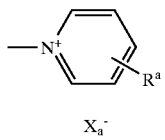

$R^1$ and $R^2$ independently represents a hydrocarbon group having from 1 to 12 carbon atoms. From a viewpoint of the storage stability of a recording layer coating solution, it is preferable that $R^1$ and $R^2$ are a hydrocarbon group having from 2 or more carbon atoms and, further, it is particularly preferable that $R^1$ and $R^2$ are taken together to form a 5-menbered ring or a 6-menbered ring.

$Ar^1$ and $Ar^2$ may be the same or different, and represent an aromatic hydrocarbon group which may have a substituent. Examples of a preferable aromatic hydrocarbon group include a benzene ring and a naphthalene ring. In addition, examples of a preferable substituent include a hydrocarbon group having from 12 or less carbon atoms, a halogen atom, and an alkoxy group having from 12 or less carbon atoms. $Y^1$ and $Y^2$ may be the same or different, and represent a sulfur atom or a dialkylmethylene group having from 12 or less carbon atoms. $R^3$ and $R^4$ may be the same or different, and represent a hydrocarbon group having from 20 or less carbon atoms which may have a substituent. Examples of a preferable substituent include an alkoxy group having from 12 or less carbon atoms, a carboxyl group, and a sulfo group. $R^5$, $R^6$, $R^7$ and $R^8$ may be the same or different, and represent a hydrogen atom or a hydrocarbon group having from 12 or less carbon atoms. From a viewpoint of availability of a raw material, preferable is a hydrogen atom. In addition, $Z_a^-$ represents a counteranion, provided that, when a cyanine dye represented by the general formula (a) has an anionic substituent in its structure and neutralization of a charge is not necessary, $Z_a^-$ is not necessary. From a viewpoint of the storage stability of a recording layer coating solution, examples of preferable $Z_a^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an aryl sulfonate ion.

Examples of the cyanine dye represented by the general formula (I) which can be suitably used in the invention are those described in paragraph Nos. [0017] to [0019] in JP-A No. 2001-133969.

In addition, particularly preferable examples include particular indoleninecyanine dyes described in Japanese Patent Application Nos. 2001-6326 and 2001-237840.

As a pigment which is used in the invention, commercially available pigments and pigments described in Color Index (C.I.) Handbook, "Latest Pigment Handbook" (edited by Nihon Pigment Technique Society, published in 1977), "Latest Pigment Application Technique" (published by CMC in 1986), and "Printing Ink Technique" (published by CMC in 1984) can be utilized.

As a kind of a pigment, there are a black pigment, a yellow pigment, an orange pigment, a brown pigment, a red pigment, a purple pigment, a blue pigment, a green pigment, a fluorescent pigment, a metal powder pigment, and a polymer binding pigment. Specifically, an insoluble azo pigment, an azo lake pigment, a condensed azo pigment, a chelate azo pigment, a phthalocyanine series pigment, an anthraquinone series pigment, a perylene and perynone series pigment, a thioindigo series pigment, a quinacridone series pigment, a dioxazine series pigment, an isoindolinone series pigment, a quinophthalone series pigment, an in-mold decorating lake pigment, an azine pigment, a nitroso pigment, a nitro pigment, a natural pigment, a fluorescent pigment, an inorganic pigment, carbon black and the like can be used. Among these pigments, carbon black is preferable.

These pigments may be used without surface treatment, or may be used by surface treatment. As a method of surface treatment, there can be contemplated a method of surface-coating a resin or a wax, a method of attaching a surfactant, and a method of binding a reactive substance (e.g. silane coupling agent, epoxy compound, polyisocyanate etc.) to the surface of a pigment. The above-mentioned surface treating methods are described in "Property and Application of Metal Soap" (Saiwai Shobou), "Printing Ink Technique" (published by CMC in 1984) and "Latest Pigment Application Technique" (published by CMC in 1986).

A particle diameter of a pigment is preferably in the range of 0.01 μm to 10 μm, more preferably in the range of 0.05 μm to 1 μm, particularly preferably in the range of 0.1 μm to 1 μm. When a particle diameter of a pigment is less than 0.01 μm, it is not preferable in the stability of a dispersion in an image photosensitive layer coating solution. On the other hand, when the particle diameter exceeds 10 μm, it is not preferable in the viewpoint of the uniformity of an image photosensitive layer.

As a method of dispersing a pigment, the known dispersing techniques which are used in ink preparation and toner preparation can be employed. Examples of a dispersing machine include an ultrasound disperser, a sand mill, an attritor, a pearl mill, a super mill, a ball mill, an impeller, a disperser, a KD mill, a colloid mill, a dynatron, a three-roll mill, a press kneader and the like. The details are described in "Latest Pigment Application Technique" (published by CMC in 1986).

These infrared absorbing agents may be added to the same layer as that for other components, or another layer may be provided, and the agent may be added thereto. It is preferable that, upon preparation of a negative planographic printing plate precursor, the optical concentration at an absorption maximum in a wavelength in the range of 760 nm to 1200 nm of a photosensitive layer is between 0.1 to 3.0. When the concentration is outside this range, there is a tendency that a sensitivity is reduced. Since the optical concentration is determined by an amount of the infrared absorbing agent to be added and a thickness of a recording layer, a prescribed optical concentration is obtained by controlling both conditions. The optical concentration of a recording layer can be measured by the conventional method. As a measuring method, for example, there are a method of forming a recording layer having such a thickness that an amount of coating after drying is appropriately determined in the range necessary as a planographic printing plate, on a transparent or white support, and measuring the optical concentration with a transmission optical densitometer, and a method of forming a recording layer on a reflective support such as aluminium, and measuring the reflection concentration.

(B) Radical Generator

A radical generator used in the invention refers to (A) a compound which is used in combination with an infrared absorbing agent and generates radicals upon irradiation with an infrared laser. Examples of a radical generator include an onium salt, a triazine compound having a trihalomethyl group, a peroxide, an azo series polymerization initiator, an azide compound and quinonediazide, and an onium salt is highly sensitive, being preferable.

An onium salt which can be suitably used as a radical polymerization initiator in the invention will be explained. Examples of a preferable onium salt include an iodonium salt, a diazonium salt, and a sulfonium salt. In the invention, these onium salts function as a radical polymerization initiator not as an acid generator. Onium salts which are suitable in the invention are onium salts represented by the following general formulas (III) to (V).

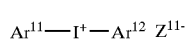

General formula (III)

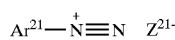

General formula (IV)

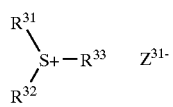

General formula (V)

In the formula (III), $Ar^{11}$ and $Ar^{12}$ independently represents an aryl group having from 20 or less carbon atoms which may have a substituent. Examples of a preferable substituent when this aryl group has a substituent include a halogen atom, a nitro group, an alkyl group having from 12 or less carbon atoms, an alkoxy group having from 12 or less carbon atoms, and an aryloxy group having from 12 or less carbon atoms. $Z^{11-}$ represents a counterion selected from the group consisting of a halogen ion, a perchlorate ion, a tetrafluoroborate ion, a hexafluorophosphate ion, a carboxylate ion and a sulfonate ion, preferably, a perchlorate ion, a hexafluorophosphate ion, a carboxylate ion and an arylsulfonate ion.

In the formula (IV), $Ar^{21}$ represents an aryl group having from 20 or less carbon atoms which may have a substituent. Examples of a preferable substituent include a halogen atom, a nitro group, an alkyl group having from 12 or less carbon atoms, an alkoxy group having from 12 or less carbon atoms, an aryloxy group having from 12 or less carbon atoms, an alkylamino group having from 12 or less carbon atoms, a dialkylamino group having from 12 or less carbon atoms, an arylamino group having from 12 or less carbon atoms, and a diarylamino group having from 12 or less carbon atoms. $Z^{21-}$ and $Z^{11-}$ represent a counterion having the same meaning.

In the formula (V), $R^{31}$, $R^{32}$ and $R^{33}$ may be the same or different, and represent a hydrocarbon group having from 20 or less carbon atoms which may have a substituent. Examples of a preferable substituent include a halogen atom, a nitro group, an alkyl group having from 12 or less carbon atoms, an alkoxy group having from 12 or less carbon atoms, and an aryloxy group having from 12 or less carbon atoms. $Z^{31-}$ represents a counterion having the same meaning as that of $Z^{11-}$.

In the invention, examples of an onium salt which can be suitably used as a radical generator include onium salts described in paragraph Nos. [0030] to [0033] in JP-A No. 2001-133969.

A radical generator which is used in the invention has a maximum absorption wavelength of, preferably, 400 nm or shorter, more preferably 360 nm or shorter. By rendering an absorbing wavelength in an ultraviolet-ray region like this, a planographic printing plate precursor can be handled under a white lamp.

These radical generators can be added to a photosensitive layer coating solution at a ratio of 0.1 to 50% by weight, preferably 0.5 to 30% by weight, particularly preferably 1 to 20% by weight relative to all solid contents in the photosensitive layer coating solution. When an addition amount is less than 0.1% by weight, a sensitivity is lowered. On the other hand, when the amount exceeds 50% by weight, stain generates on a non-image part at printing. These radical generators may be used alone or in a combination of 2 or more. In addition, these radical generators may be added to the same layer as that for other components, or another layer may be provided, and radical generators may be added thereto.

(C) Radical Polymerizable Compound

A radical polymerizable compound used in the invention is a radical polymerizable compound having at least one ethylenic unsaturated double bond, and is selected from compounds having at least one, preferably two or more terminal ethylenic unsaturated bonds. Such the compound group is widely known in the present industrial field and can be used without any limitation in the invention. These have the chemical form such as a monomer, a prepolymer, that is, a dimer, a trimer and an oligomer, and a mixture thereof and a copolymer thereof. Examples of a monomer and a copolymer thereof include unsaturated carboxylic acid (e.g. acrylic acid, methacrylic acid, itaconic acid, crotonic acid, isocrotonic acid, maleic acid etc.), and esters and amides thereof and, preferably, an ester of unsaturated carboxylic acid and fatty polyvalent alcohol compound, and amides of unsaturated carboxylic acid and fatty polyvalent amine compound are used. In addition, adducts of unsaturated carboxylic acid esters having a nucleophilic substituent such as a hydroxyl group, an amino group, a mercapto group and the like, or amides, and monofunctional or polyfunctional isocyanates or epoxides, and dehydration condensed reaction products with monofunctional or polyfunctional carboxylic acid are also used suitably. In addition, adducts of unsaturated carboxylic acid esters having an electrophilic substituent such as an isocyanate group and an epoxy group, or amides, and monofunction or polyfunctional alcohols, amines or thiols, and substitution reaction products of unsaturated carboxylic acid esters having a leaving substituent such as a halogen group and a tosyloxy group, or amides, and monofunctional or polyfunctional alcohols, amines or thiols are also preferable. In addition, as another example, a compound group in which the above-mentioned unsaturated carboxylic acid is replaced with unsaturated phosphonic acid, styrene or the like may be used.

Examples of acrylic acid ester, methacrylic acid ester, itaconic acid ester, crotonic acid ester, isocrotonic acid ester, and maleic acid ester which are a radical polymerizable compound as an ester of fatty polyvalent alcohol compound and unsaturated carboxylic acid are described in paragraph Nos. [0037] to [0042] in JP-A No. 2001-133969, and these can be also applied to the invention.

As an example of other esters, for example, fatty alcohol series esters described in JP-B Nos. 46-27926, 51-47334 and JP-A No. 57-196231, esters having an aromatic skeleton described in JP-A Nos. 59-5240, 59-5241 and 2-226149, and esters containing an amino group described in JP-A No. 1-165613 are also suitably used.

In addition, examples of a monomer which is an amide of fatty polyvalent amino compound and unsaturated carboxylic acid include methylenebis-acrylamide, methylenebismethacrylamide, 1,6-hexamethylenebis-acrylamide, 1,6-hexamethylenebis-methacrylamide, diethylenepolyaminetrisacrylamide, xylylenebisacrylamide, xylylenebismethacrylamide and the like.

As an example of other preferable amide series monomers, there are monomers having a cyclohexylene structure described in JP-B No. 54-21726.

In addition, an urethane series addition polymerizable compound which is prepared using an addition reaction of isocyanate and hydroxyl group is also suitable, and examples thereof include vinylurethane compounds containing two or more polymerizable vinyl groups in one molecule in which a vinyl monomer containing a hydroxyl group represented by the following formula (VI) is added to a polyisocyanate compound having two or more isocyanate groups in one molecule, described in JP-B No. 48-41708:
General formula (VI)

$CH_2=C(R^{41})COOCH_2CH(R^{42})OH$ (wherein $R^{41}$ and $R^{42}$ represent H or $CH_3$.)

In addition, urethaneacrylates described in JP-A No. 51-37193, JP-B Nos. 2-32293 and 2-16765, and urethane compounds having an ethylene oxide series skeleton described in JP-B Nos. 58-49860, 56-17654, 62-39417 and 62-39418 are also preferable.

Further, radical polymerizable compounds having an amino structure or sulfide structure in a molecule described in JP-A Nos. 63-277653, 63-260909 and 1-105238 may be used.

Other examples include polyester acrylates, and polyfunctional acrylates and methacrylates such as epoxy acrylates obtained by reacting epoxy resin and (meth)acrylic acid described in JP-A No. 48-64183, JP-B Nos. 49-43191 and 52-30490. In addition, further examples include particular unsaturated compounds described in JP-B Nos. 46-43946, 1-40337 and 1-40336, and vinylphosphonic acid series compounds described in JP-A No. 2-25493. In addition, in some cases, a structure containing a perfluoroalkyl group described in JP-A No. 61-22048 is suitably used. Further, polymerizable compounds which are introduced as a photocurable monomer and an oligomer in "*Bulletin of Nihon Adhesion Society*", vol.20, No. 7, pp.300–308 (1984) can be also used.

Details of how to use such as what a structure is used, whether used alone or jointly, and what an addition amount it is regarding these radical polymerizable compounds can be arbitrarily set in conformity with design of performance of the final photosensitive composition. For example, when a photosensitive composition is used as an image recording material as in the invention, details are selected from the following viewpoint. In the sensitivity, a structure having a large content of an unsaturated group per one molecule is preferable, and di- or more functional is preferable in many cases. In addition, in order to enhance the strength of an image part, that is, a cured film, tri- or more functional is better. Further, a method of regulating both the sensitivity and the strength by using by combining compounds having different functional numbers and different polymerizable groups (e.g. acrylic acid ester series compound, methacrylic acid ester series compound, styrene series compound etc.) is also effective. A compound having a large molecular weight and a compound having the high hydrophobicity are excellent in the sensitivity and the film strength. Conversely, when used as a recording layer of a planographic printing plate, those compounds are not preferable in a developing speed and precipitation in a developer in some cases. In addition, selection and a method of using of a radical polymerizable compound are an important factor for the compatibility and the dispersibility with other components (e.g. binder polymer, initiator, colorant etc.) in a photosensitive layer and for example, the compatibility may be improved by use of a low purity compound, and joint use of two or more compounds in some cases.

In addition, in order to improve the adherability of a support, an overcoat layer and the like, a particular structure may be selected in some cases. Regarding a ratio of incorporating a radical polymerizable compound in an image recording layer, a higher ratio is advantageous from the viewpoint of the sensitivity. However, when a ratio is too high, not preferable phase separation occurs, and there arise a problem on a preparing step due to the adherability of an image recording layer (e.g. deteriorated preparation derived from transfer and adhesion of recording layer components) and a problem of occurrence of precipitation from a developer. From these viewpoints, a preferable ratio of incorporating a radical polymerizable compound is 5 to 80% by weight, preferably 20 to 75% by weight relative to all components of a composition in many cases. In addition, these may be used alone, or two or more of them may be used jointly. In addition, in a method of using a radical polymerizable compound, from the viewpoint of an extent of polymerization inhibition to oxygen, the resolution, the fog property, a change in an refractive index, the surface adherability and the like, suitable structure, incorporation and addition amount can be arbitrarily selected and, further, in some cases, a layer construction and a coating method such as undercoating and overcoating may be implemented.

(D) Binder Polymer

In an image recording layer in the invention, in order to improve the film property of an image recording layer to be formed, other binder polymers may be used, if necessary, in addition to the above-mentioned polymer compounds used for controlling a variation in the sensitivity. It is preferable that a linear organic polymer is used as a binder. Such the "linear organic polymer", the known polymers can be arbitrarily used. Preferably, in order to make water development or weak aqueous alkali development possible, linear organic polymers which are insoluble or can be swollen in water or a weak aqueous alkali are selected. Linear organic polymers are selected and used depending on utility not only as a film forming material for forming a photosensitive layer but also as a water, weak aqueous alkali or organic solvent developer. For example, when a water-soluble organic polymer is used, water development becomes possible. As such the linear organic polymer, there are radical polymers having a carboxylic acid group on a side chain, for example, those described in JP-A No. 59-44615, JP-B Nos. 54-34327, 58-12577, 54-25957, JP-A Nos. 54-92723, 59-53836 and 59-71048, that is, a methacrylic acid copolymer, an acrylic acid copolymer, an itaconic acid copolymer, a crotonic acid copolymer, a maleic acid copolymer, a partially esterified maleic acid copolymer and the like. Additionally, there are acylic cellulose derivatives also having a carboxylic acid group on a side chain. Besides, polymers in which a cyclic acid anhydride is added to a polymer having a hydroxyl group are useful.

Among them, in particular, a (meth)acrylic resin having a benzyl group or an ally group and a carboxyl group on a side chain is excellent in balance between the film strength, the sensitivity and the developing property, being preferable.

In addition, since urethane series binder polymers having an acid group described in JP-B Nos. 7-12004, 7-120041, 7-120042, 8-12424, JP-A Nos. 63-287944, 63-287947, 1-271741 and Japanese Patent Application No. 10-116232 are considerably excellent in the strength, they are advantageous from the viewpoint of the printing endurance and the low exposure suitability.

Further, besides, as a water-soluble linear organic polymer, polyvinylpyrrolidone and polyethylene oxide are effective. In addition, in order to enhance the strength of a cured film, alcohol-soluble nylon and polyether of 2,2-bis-(4-hydroxyphenyl)-propane and epichlorohydrin are useful.

A weight average molecular weight of a polymer used in the invention is preferably 5000 or higher, more preferably in the range of 10,000 to 300,000, and a number average molecular weight is preferably 1000 or higher, more preferably in the range of 2,000 to 250,000. A polydispersity (weight average molecular weight/number average molecular weight) is preferably 1 or higher, more preferably in the range of 1.1 to 10.

These polymers may be any of a random polymer, a block polymer, a graft polymer and the like, and a random polymer is preferable.

Polymers used in the invention can be synthesized by the previously known methods. Examples of a solvent which is used upon synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimthylformamide, N,N-dimethylacetamide, toluene, ethyl acetate, methyl lactate, ethyl lactate, dimethyl sulfoxide, water and the like. These solvents are used alone or by mixing two or more kinds.

As a radical polymerization initiator which is used upon synthesis of a polymer used in the invention, the known compounds such as an azo series initiator, a peroxide initiator and the like can be used.

Binder polymers used in the invention may be used alone or by mixing them. These polymers are added to a photosensitive layer at a ratio of 20 to 95% by weight, preferably 30 to 90% by weight relative to all solid contents in a photosensitive layer coating solution. When an addition amount is less than 20% by weight, the strength of an image is insufficient upon image formation. On the other hand, when the addition amount exceeds 95% by weight, an image is not formed. In addition, a ratio by weight of a compound having a radical polymerizable ethylenic unsaturated double bond and a linear organic polymer is preferably in the range of 1/9 to 7/3.

Other Components of Photosensitive Layer

In the invention, various compounds may be added, if necessary, besides these compounds.

For example, from the viewpoint of suppressing a variation in the sensitivity, in order to maintain a life of radicals generated by a radical polymerization initiator, amines, thiols, carbazoles, morpholines may be added.

In addition, for example, dyes having great absorption in a visible light region can be used as a colorant. Specific examples thereof include Oil Yellow #101, Oil Yellow #103, Oil Pink#312, Oil Green BC, Oil Blue BOS, Oil Blue #603, Oil Black BY, Oil Black BS, Oil Black T-505 (all trade names, manufactured by Orient Chemical Industries, Ltd.), Victorial Pure Blue, Crystal Violet (CI42555), Methyl Violet (CI42535), Ethyl Violet, Rhodamine B (CI145170), Malachite Green (CI42000), Methylene Blue (CI52015) and the like, and dyes described in JP-A No. 62-293247. In addition, pigments such as phthalocyanine series pigment, azo series pigment, carbon black and titanium oxide can be suitably used.

Usually, these colorants are added so that an image after image formation can be confirmed with naked eyes. Thereby, it becomes easy to discriminate an image part and a non-image-part after image formation. In particular, in the invention, it is useful in that it becomes possible to measure directly the image concentration for detecting the aforementioned sensitivity (S). It is preferable that an amount of a colorant to be added is a ratio of 0.01 to 10% by weight relative to all solid contents in a photosensitive coating solution.

Further, from the viewpoint of high contrast, in order to prevent oxygen polymerization inhibition, tertiary amines, thiols, and compounds containing a tetrahydrofurfuryl group may be used if necessary.

In addition, in the invention, it is desirable to add a small amount of a hot polymerization preventing agent in order to inhibit unnecessary hot polymerization of a compound having a radical polymerizable ethylenic unsaturated double bond during preparation or storage of a coating solution when a film of a photosensitive composition is made. Examples of a suitable hot polymerization preventing agent include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitroso-N-phenylhydroxylamine aluminium salt and the like. It is preferable that an amount of a hot polymerization preventing agent to be added is about 0.01% by weight to about 5% by weight relative to a weight of the whole composition. In addition, if necessary, in order to prevent polymerization inhibition by oxygen, a higher fatty acid derivative such as behenic acid and behenic acid amide may be added so that they are present locally on the surface of a photosensitive layer in a process of drying after coating. It is preferable that an amount of a higher fatty acid derivative to be added is about 0.1% by weight to about 10% by weight of the whole composition.

In addition, in order to extend the treatment stability to the developing conditions, nonionic surfactants described in JP-A Nos. 62-251740 and 3-208514, and amphoteric surfactants described in JP-A Nos. 59-121044 and 4-13149 may be added to a photosensitive layer coating solution in the invention.

Examples of the nonionic surfactant include Sorbitan tristearate, Sorbitan monopalmitate, Sorbitan trioleate, stearic acid monoglyceride, polyoxyethylene nonyl phenyl ether and the like.

Examples of the amphoteric surfactant include alkyldi(aminoethyl)glycine, alkylpolyaminoethylglycine hydrochloride, 2-alkyl-N-carboxyethyl-N-hydroxyethylimidazoliniumbetaine, N-tetradecyl-N,N-betaine type (e.g. trade name: Amogen K, manufactured by Daiichi Kogyo K.K.) and the like.

A ratio of the above-mentioned nonionic surfactant and anphoteric surfactant occupying in a photosensitive layer coating solution is preferably 0.05 to 15% by weight, more preferably 0.1 to 5% by weight.

Besides, additives such as an adherability improving agent, a development modifier, an ultraviolet ray absorber, a lubricant and the like may be suitably incorporated depending on the purposes.

Further, if necessary, in order to impart the softness of a film, a plasticizer is added to a photosensitive layer coating solution in the invention. For example, polyethylene glycol, tributyl citrate, diethylphthalate, dibutylphthalate, dihexyl phthalate, dioctyl phthalate, tricresyl phosphate, tributyl phosphate, trioctyl phosphate, oleic acid tetrahydrofurfuryl and the like are used.

For preparing a planographic printing plate precursor of the invention, usually, the above-mentioned respective components necessary for a photosensitive layer (image recording layer) coating solution are dissolved in a solvent, and the solution is coated on a suitable support. Examples of a solvent to be used herein are not limited to, but include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, water and the like. These solvents are used alone or by mixing. The concentration of the above-mentioned components (all solid contents including additives) in a solvent is preferably 1 to 50% by weight.

In addition, an amount (solid content) of a photosensitive layer coating on a support which is obtained after coating and drying is different depending on utility, and, in the case of a planographic printing plate precursor, generally, is preferably 0.5 to 5.0 g/m$^2$. As a coating amount grows smaller, the apparent sensitivity grows higher, but the film property of a photosensitive layer which plays a role in function of image recording is reduced.

As a coating method, various methods can be used, and examples thereof include a bar coater coating, spin coating, spray coating, curtain coating, dip coating, air knife coating, blade coating, roll coating and the like.

As a surfactant for improving the coating property, for example, a fluorine series surfactant described in JP-A No. 62-170950 may be added to a photosensitive layer coating solution in the invention. An addition amount is preferably 0.01 to 1% by weight, more preferably 0.05 to 0.5% by weight in a material solid content in the whole photosensitive layer.

Support

A negative planographic printing plate precursor of the invention is formed by coating the above-mentioned image recording layer on a support. A support which can be used herein is not particularly limited as far as it is a dimensionally stable plate-like material, and there can be exemplified a paper, a paper on which a plastic (e.g. polyethylene, polypropylene, polystyrene etc.) is laminated, a metal plate (e.g. aluminium, zinc, copper etc.), a plastic film (e.g. cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal etc.), a paper or a plastic film on which the above metal is laminated or deposited, and the like. Examples of a preferable support include a polyester film and an aluminium plate.

As a support which is used in a planographic printing plate precursor of the invention, it is preferable to use an aluminium plate which is light and excellent in the surface treating property, the processibility and the corrosion resistance. Examples of an aluminium material which is used in this purpose include JIS A1050 alloy containing 99.5% or more of aluminium, 0.30% of Fe, 0.10% of Si, 0.02% of Ti and 0.013% of Cu, Al—Mg series alloy, Al—Mn series alloy, Al—Mn—Mg series alloy, Al—Zr series alloy and Al—Mg—Si series alloy.

A suitable aluminium plate is a pure aluminium plate or the above-mentioned alloy plate containing aluminium as a main component and a minor amount of heterogenous elements, or may be a plastic film on which aluminium is laminated or deposited. Examples of heterogenous elements contained in an aluminium alloy include silicon, iron, manganese, copper, magnesium chromium, zinc, bismuth, nickel and titanium. The content of heterogenous elements in an alloy is 10% by weight or smaller. As an aluminium plate, pure aluminium is preferable. However, it is difficult to prepare completely pure aluminium from the viewpoint of refining technique, and an aluminium plate may contain a slight amount of heterogenous elements. Like this, a composition of an aluminium plate is not specified, but an aluminium plate which is the previously known and used material can be appropriately utilized. A thickness of the aluminium plate is preferably about 0.1 to 0.6 mm, more preferably 0.15 to 0.4 mm, particularly preferably 0.2 to 0.3 mm.

Prior to roughening the aluminium plate, if desired, defatting treatment is performed with a surfactant, an organic solvent or an aqueous alkaline solution in order to remove a rolling oil on the surface. Treatment of roughening the surface of an aluminium plate is performed by various methods, for example, a method of mechanical roughening, a method of roughening by electrochemically dissolving the surface and a method of selectively dissolving the surface chemically. As a mechanical method, the known methods such as ball abrading method, a brush abrading method, a blast abrading method and a buff abrading method can be used. In addition, as an electrochemical roughening method, there is a method of performing roughening by alternating current or direct current in a hydrochloric acid or nitric acid electrolyte solution.

The thus roughened aluminium plate is subjected to alkali etching treatment and neutralization treatment, if necessary, and thereafter, is subjected to anode oxidizing treatment in order to enhance the moisture retaining property and the abrasion resistance of the surface, if desired. An amount of an anode oxidized film by anode-oxidation is preferably 1.0 g/m$^2$ or larger. When an amount of an anode-oxidized film is less than 1.0 g/m$^2$, the printing endurance is insufficient and, when used as a planographic printing plate, scars (scratches) are easily caused in a non-image part, and adhering of an ink to a scratched part, so-called "scar staining" is easily caused at printing in some cases. After the above-mentioned anode-oxidizing treatment, the surface of the aluminium is subjected to hydrophilizing treatment if necessary.

In addition, such the aluminium support can be used by treatment with an organic acid or a salt thereof or application of an undercoating layer for photosensitive layer coating, after anode oxidizing treatment.

In order to enhance the adherability between a support and a photosensitive layer, an intermediate layer may be provided. In order to improve the adherability, an intermediate layer is generally comprised of a diazo resin or a phosphate compound which is adsorbed onto aluminium. A thickness of an intermediate layer is arbitrary, and must be such a thickness that a uniform bond forming reaction can be performed with an upper layer of a photosensitive layer upon exposure. Usually, a coating ratio of about 1 to 100 mg/m$^2$ as a dry solid is better, and 5 to 40 mg/m is particularly better. A ratio of a diazo resin to be used in an intermediate layer is 30 to 100%, preferably 60 to 100%.

After the surface of the support is subjected to the above-mentioned treatment or undercoating, a back coating is provided on a back surface of a support if necessary. As such the back coating, a covering layer comprising a metal oxide obtained by hydrolyzing and polycondensing organic polymer compounds described in JP-A No. 5-45885 or organic or inorganic metal compounds described in JP-A No. 6-35174 is preferably used.

The preferable property as a support for a planographic printing plate is central line average roughness of 0.10 to 1.2 μm. When roughness is lower than 0.10 μm, the adherability with a photosensitive layer is reduced, resulting in remarkable decrease in the printing endurance. When the roughness is larger than 1.2 μm, the staining property at printing is deteriorated. Further, the color concentration of a support is 0.15 to 0.65 as a reflective concentration value. When the concentration is whiter than 0.15, halation at image exposure is too intensive, damaging image formation. When the concentration is blacker than 0.65, it is difficult to see an image at plate examining work after development, resulting in the remarkably deteriorated plate examining property.

As described above, the planographic printing plate precursor of the invention can be obtained by forming the above-mentioned photosensitive layer and, further, other arbitrary layers such as a surface protecting layer, a back coating layer and the like on a support which has been obtained by performing prescribed treatment. In the planographic printing plate precursor of the invention, an image is recorded by an infrared laser. In addition, it is possible to perform thermal recording with an ultraviolet lamp or a thermal head. In the invention, it is preferable to perform image exposure by a solid laser or a semiconductor laser which emits infrared-ray having a wavelength of 760 nm to 1200 nm. An output of a laser is preferably 100 mW or higher. In order to shorten an exposing time, it is preferable to use a multibeam laser device. In addition, it is preferable that an exposing time per one pixel is within 20 μs. It is preferable that the energy to be irradiated to a recording material is 10 to 300 mJ/cm$^2$. When the exposing energy is too low, curing of an image recording layer does not progress sufficiently, and a sensitivity ratio defined by the invention can not be attained in some cases.

Exposure in the invention is performed by overlapping light beams of a light source. Overlapping refers to a sub-scanning pitch width smaller than a beam diameter. For example, when a beam diameter is expressed by a full-width at half maximum (FWHM), overlapping can be quantitatively expressed as FWHM/sub-scanning pitch width (overlapping coefficient). In the invention, it is preferable that this overlapping coefficient is 0.1 or larger.

A scanning format of a light source of an exposing device used in the invention is not particularly limited, but a cylindrical external surface scanning format, a cylindrical inner surface scanning format and a flat surface scanning format can be used. In addition, a channel of a light source may be a single channel or a multichannel and, in the case of a cylindrical external surface format, a multichannel is preferably used.

As a developer and a replenisher which are used in development and plate-making for a planographic printing plate of the invention, the previously known aqueous alkali solution can be used.

Examples thereof include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate, ammonium borate, sodium hydroxide, ammonium hydroxide, potassium hydroxide and lithium hydroxide. Alternatively, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine can be used. These alkali agents are used alone or by combining two or more kinds.

Among these alkali agents, a particularly preferable developer includes an aqueous silicate solution such as sodium silicate, potassium silicate and the like because the developing property can be regulated by a ratio and concentrations of silicon oxide $SiO_2$ and an alkali metal oxide $M_2O$ which are components of silicate and, for example, alkali metal silicates described in JP-A No. 54-62004 and JP-B No. 57-7427 are effectively used.

When development is effected by using an automatic developing machine, it is known that, by adding an aqueous solution having the higher alkaline intensity than that of a developer (replenisher) to a developer, many PS plates can be treated without exchanging a developer in a developing tank for a long period of time. Also in the invention, this replenishing format is preferably applied. In order to promote or suppress the developing property and enhance dispersion of development scums and the ink-philicity of a printing plate image part, various surfactants and organic solvents may be added to a developer and a replenisher if necessary.

Examples of a preferable surfactant include anionic, cationic, nonionic and amphoteric surfactants. Further, reducing agents such as hydroquinone, resorcine, a sodium salt, a potassium salt and the like of an inorganic acid such as sulfurous acid and hydroosulforous acid and, further, an organic carboxylic acid, an anti-forming agent and a hard water softening agent may be added to a developer and a replenisher if necessary.

The printing plate which has been developed using the above-mentioned developer and replenisher is post-treated with washing water, a rinsing solution containing a surfactant and the like, or a desensitizing solution containing gum arabic or a starch derivative. As post-treatment when an image recording material of the invention is used as a printing plate, these treatments can be used by variously combining them.

An automatic developing machine is generally composed of a developing part and a post-treating part, and is composed of a device for conveying a printing plate material, each treating solution tank and a spraying device, and performs development processing by spraying each pumped up treating solution through a spraying nozzle while horizontally conveying an exposed printing plate. Alternatively, there has been recently known a method of treatment by dipping and conveying a printing plate material in a treating solution tank filled with a treating solution by a submerged guide role or the like. In such the automatic treatment, treatment can be performed while supplementing a replenisher to each treating solution depending on a treating amount and a working time. Alternatively, the electrical conductivity is sensed with a sensor, whereby, a replenisher may be automatically supplemented. Alternatively, a so-called disposable treating format of treating with a substantially unused treating solution may be applied. According to the method of the invention, since there is no possibility that the developing property is reduced due to carbonic acid gas with time or the printing endurance is reduced due to a developer, the method of the invention can be suitably applied to all of these automatic developing machines.

The thus obtained planographic printing plate is optionally coated with a desensitizing gum and, thereafter, can be used in a printing step and, when a planographic printing plate having the further high printing endurance is desired, the plate is subjected to burning treatment.

When a planographic printing plate is subjected to burning, it is preferable to treat with a surface-adjusting solution described in JP-B Nos. 61-2518, 55-28062, JP-A Nos. 62-31859 and 61-159655 before burning.

As a method therefor, a method of coating the surface-adjusting solution on a planographic printing plate with a sponge or an absorbent cotton impregnated with the surface-adjusting solution, or coating by dipping a printing plate in a vat filled with a surface-adjusting solution, or coating with an automatic coater is applied. In addition, uniformalization of a coating amount with a squeegee or a squeegee roller after coating affords the better results. Generally, an amount of a surface-adjusting solution to be coated is suitably 0.03 to 0.8 $g/m^2$ (dry weight).

A planographic printing plate on which a surface-adjusting solution is coated is dried, if necessary, and thereafter, is heated to a high temperature with a burning processor (e.g. trade name: Burning Processor BP-1300, manufactured by Fuji Photo Film Co., Ltd.) or the like. In this case, a heating temperature and a heating time are preferably in the range of 180 to 300° C. and 1 to 20 minutes depending on kinds of components constituting an image.

The burning-treated planographic printing plate can be appropriately subjected to the previously performed treatments such as water washing, gum coating and the like if necessary. When a surface-adjusting solution containing a water-soluble polymer compound is used, so-called desensitizing treatment such as gum coating can be omitted.

A planographic printing plate obtained from a negative planographic printing plate precursor for infrared exposure of the invention is subjected to an offset printer and the like, and is used for printing many sheets.

EXAMPLES

The present invention will be explained in detail by way of Examples, but is not limited by them.

Example 1

Preparation of Support

A molten metal of a JIS A1050 alloy containing 99.5% or more of aluminium, 0.30% of Fe, 0.10% of Si, 0.02% of Ti and 0.013% of Cu was subjected to cleaning treatment, followed by casting. In the cleaning treatment, degassing treatment was performed to remove an unnecessary gas such as hydrogen in a molten metal, and ceramic tube filter treatment was performed. A casting was performed by a DC casting method. A coagulated ingot having a plate thickness of 500 mm was cut from the surface by 10 mm, and was subjected to homogenizing treatment at 550° C. for 10 hours so that an intermetallic compound would not grow. Then, after subjecting to a hot rolling at 400° C. and an annealing at 500° C. for 60 seconds in a continuous annealing furnace, cold rolling was afforded to the ingot so that the ingot is formed to an aluminium rolled plate having a plate thickness of 0.30 mm. By controlling a roughness of a rolling roll, a centerline average surface roughness Ra of the plate surface after cold rolling was controlled at 0.2 $\mu$m. Thereafter, the plate was subjected to a tension leveler in order to improve the flatness.

Then, surface treatment for obtaining a planographic printing plate support was performed.

First, in order to remove a rolling oil on the surface of an aluminium plate, the plate was subjected to defatting treatment with a 10% aqueous sodium aluminate solution at 50° C. for 30 seconds, neutralized with a 30% aqueous sulfuric acid solution at 50° C. for 30 minutes, and was subjected to desmutting.

Then, in order to render the adherability between a support and a photosensitive layer better and impart the moisture retaining property to a non-image part, so-called sand graining treatment for roughing the surface of a support was performed. The electrolysis sand graining was performed by maintaining an aqueous solution containing 1% nitric acid and 0.5% aluminium nitrate at 45° C., and supplying an electricity amount on an anode side of 240 $C/dm^2$ in an alternating wave form at a current density of 20 $A/dm^2$ and a duty ratio of 1:1 from an indirect feeding cell while letting an aluminium web flow in the aqueous solution. Thereafter, etching treatment was performed at 50° C. for 30 seconds with a 10% aqueous sodium aluminate solution, and neutralization with a 30% aqueous sulfuric acid solution at 50° C. for 30 seconds and desmutting was performed.

Further, in order to improve an abrasion resistance, a chemical resistance and a moisture retaining property, an oxidized film was formed on the support by anodic oxidation. The anodic oxidized film of 2.5 $g/m^2$ was made by using a 20% aqueous sulfuric acid solution as an electrolyte at 35° C. and performing electrolysis treatment at a direct current of 14 $A/dm^2$ by an indirect feeding cell while an aluminium web was conveying in an electrolyte. The thus made support had Ra (center line surface roughness) of 0.5 $\mu$m.

Photosensitive Layer

Then, the following photosensitive layer coating solution [P] was prepared, which was coated on an aluminium plate which had been subjected to the above-mentioned surface treatment, using a wire bar, and was dried at 115° C. for 45 seconds in a hot-air drying apparatus, to form a photosensitive layer. A covering amount after drying is 2.3 $g/m^2$.

A structure of each compound used in a photosensitive layer coating solution was shown below.

| Composition of photosensitive layer coating solution [P] | |
|---|---|
| Infrared absorbing agent (a') | 0.27% by weight |
| Radical generator (b) | 0.85% by weight |
| Radical polymerization initiation aid (c) | 0.45% by weight |
| Radical polymerizable compound (d) | 7.62% by weight |
| Radical polymerizable compound (e) | 1.59% by weight |
| Binder polymer (f) | 6.89% by weight |
| Crystal Violet (C.I.42555) | 0.33% by weight |
| Methyl glycol | 26.0% by weight |
| Methanol | 36.0% by weight |
| Methyl ethyl ketone | 20.0% by weight |

-continued

Composition of photosensitive layer coating solution [P]

Infrared absorbing agent (a')

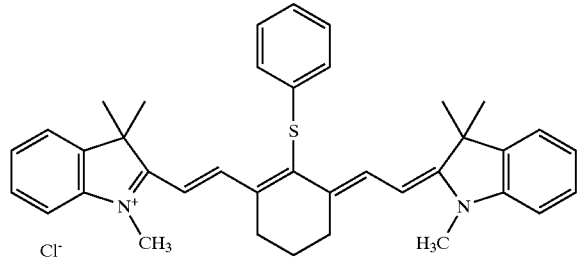

Radical generator (b)

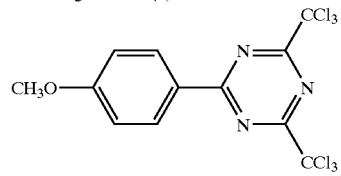

Radical polymerization initiation aid (c)

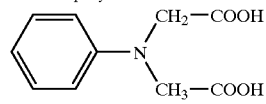

Radical polymerizable compound (d)
Urethane oligomer
(Reaction product obtained by completely reacting:

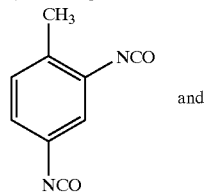

and

HO—CH$_2$CH$_2$—OCO—CH=CH$_2$

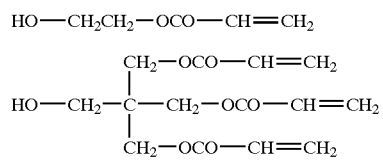

Radical polymerizable compound (e)

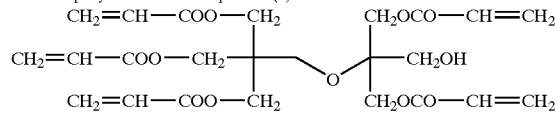

Binder polymer (f)

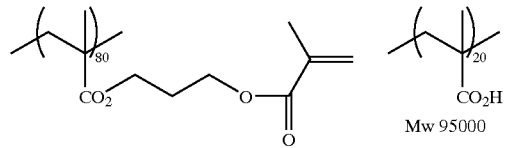

Mw 95000

Overcoat Layer

Then, polyvinyl alcohol (trade name: Airvol 1203, manufactured by Airproducts) was coated on the surface of above-mentioned photosensitive layer using a wire bar, and dried with a hot-air drying apparatus to form an overcoat layer, to obtain a negative planographic printing plate precursor of Example 1. A covering amount of an overcoat layer after drying was 2.3 g/m$^2$.

Comparative Example 1

According to the same manner as that of Example 1 except that a photosensitive coating solution 2 in which 17.3% by weight of acrylic copolymer (trade name: Ioncry 1683, manufactured by SC Johnson & Son Inc.) and 17.8% by weight of methacrylic copolymer (trade name: AC50, manufactured by PCAS) were added in place of 35.1% by weight of the alkali-soluble polymer (F), that was excellent in the reactivity, in a photosensitive coating solution 1 used in Example 1, a negative planographic printing plate precursor of Comparative Example 1 was obtained.

Exposure

The resulting negative planographic printing plate precursor was image-exposed using a plate setter (trade name: Trendsetter 3244 VFS, manufactured by Creo) equipped with a water cooling 40 W infrared-ray semiconductor laser at an output of 9 W, an outer drum rotation number of 210 rpm and a resolution of 1571 pi by varying the plate energy in 50 to 300 mJ/cm$^2$ at a 1.25-fold ratio.

Developing Treatment

The exposed image was developed using an automatic developing machine (trade name: LP-940H, manufactured by Fuji Photo Film Co., Ltd.) one minute after exposure. As a developer, a 1:17 water-diluting solution (pH 11.1 at 25° C.) of VD-2 (trade name, manufactured by Fuji Photo Film Co., Ltd.) was used. As a replenisher, a 1:10 water-diluting solution of DV-2R (trade name, manufactured by Fuji Photo Film Company Ltd.) was used. A temperature of a developing bath thereof was 30° C. In addition, as a finisher, a 1:1 water-diluting solution of FN-6 (trade name, manufactured by Fuji Photo Film Company Ltd.) was used. In addition, the similarly exposed images as developed under similar conditions 60 minutes after exposure. Cyan concentration of the resulting image was measured with a reflection densitometer (trade name: RD-918, manufactured by Macbeth). Sensitivity was obtained at an exposure amount (plate energy) for obtaining a concentration of 0.8 relative to an exposure amount that provides a maximum concentration as 1.0. The sensitivity ($S^1$, S60) at that time was measured and, as a result, $S^1$ was 100 and $S^{60}$ was 100 in Example 1, and Si was 100 and $S^{60}$ was 250 in Comparative Example 1. Namely, a sensitivity ratio of $S^1/S^{60}$ was 1.0 in Example 1 and 0.4 in Comparative Example 1.

Assessment of Printing Performance

Then, printing was implemented, and a printing endurance performance was evaluated. An image having a resolution of 1751 pi was exposed to a light at a plate energy of 100 mJ/cm$^2$, developed, then obtained planographic printing plate was subjected to printing using a printer (trade name: Lithron, manufactured by Komori Corporation) and, in Example 1, up to 100,000 printed sheets of an excellent image quality having no stain at a non-image part were stably obtained both in the case of development immediately after exposure and in the case of development 60 minutes after exposure. On the other hand, in Comparative Example 1, 100,000 printed sheets of a high quality were obtained in the case of development immediately after exposure as in Example 1, while printed sheets of a high quality could not obtained in the case of development 60 minutes after exposure.

According to the invention, a negative planographic printing plate precursor for infrared exposure which allows for direct recording from digital data such as computer and the like by recording using a solid laser and a semiconductor laser which emit infrared-ray and, in particular, which can maintain the excellent performance stability even when exposure and development of an image recording material are performed off-line, is provided.

What is claimed is:

1. A negative planographic printing plate precursor for infrared exposure comprising a support and an image recording layer formed on the support, wherein the image recording layer includes an infrared absorbing agent, a radical generator and a radical polymerizable compound, and a sensitivity ratio ($S^1/S^{60}$) of a sensitivity of the image recording layer upon being developed 60 minutes after infrared laser exposure ($S^{60}$) and a sensitivity of the image recording layer developed one minute after exposure ($S^1$) is from 0.5 to 1.0;

wherein the image recording layer includes a photosensitive composition, and the photosensitive composition includes a polymer compound which contains at least 0.1% by mol and less than 30% by mol of at least one kind of structural unit represented by the following general formulas (1), (2) and (3) and can be one of dissolved and swollen by one of water and an aqueous alkali solution:

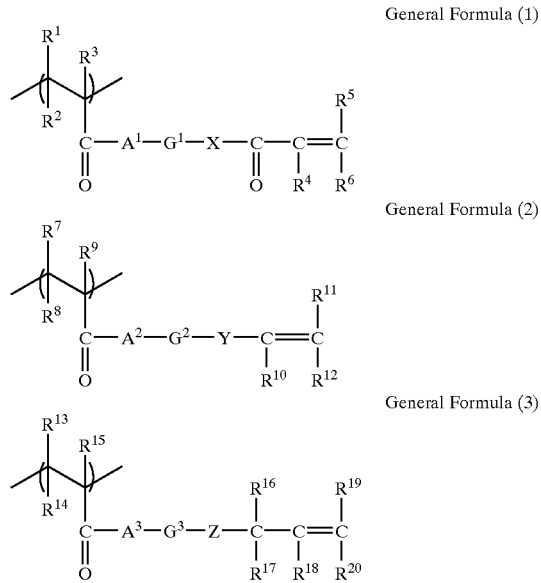

General Formula (1)

General Formula (2)

General Formula (3)

wherein each of $A^1$, $A^2$ and $A^3$ independently represents an oxygen atom, a sulfur atom or —N($R^{21}$)—; $R^{21}$ represents a hydrogen atom or an alkyl group which may have a substituent; each of $G^1$, $G^2$ and G3 independently represents a divalent organic group; each of X and Z independently represents an oxygen atom, a sulfur atom or —N($R^{22}$)—; $R^{22}$ represents an alkyl group which may have a substituent; Y represents an oxygen atom, a sulfur atom, a phenylene group which may have a substituent, or —N($R^{23}$)—; $R^{23}$ represents an alkyl group which may have a substituent; and each of $R^1$ to $R^{20}$ independently represents a hydrogen atom or monovalent organic group.

2. A negative planographic printing plate precursor according to claim 1, wherein the sensitivity ratio ($S^1/S^{60}$) is from 0.8 to 1.0.

3. A negative planographic printing plate precursor according to claim 1, wherein the polymer compound comprises a strutural unit represented by the general formula (1) and, in the general formula (1), $R^1$ and $R^2$ represent a hydrogen atom; $R^3$ represents a hydrogen atom or a methyl group; $R^4$ represents a hydrogen atom, a methyl group or an ethyl group; each of $R^5$ and $R^6$ independently represents a hydrogen atom, an alkoxycarbonyl group, an alkyl group which may have a substituent, or an aryl group which may have a substituent; and $G^1$ represents an alkyl group which may have a substituent.

4. A negative planographic printing plate precursor according to claim 1, wherein the polymer compound comprises a structural unit represented by the general formula (2) and, in the general formula (2), $R^7$ and $R^8$ represent a hydrogen atom; $R^9$ represents a hydrogen atom or a methyl group; each of $R^{10}$ to $R^{12}$ independently represents a hydrogen atom, an alkoxycarbony group, an alkyl group which may have a substituent, or an aryl group which may have a substituent; and $G^2$ represents an alkyl group which may have a substituent.

5. A negative planographic printing plate precursor according to claim 1, wherein the polymer compound comprises a structural unit represented by the general formula (3) and, in the general formula (3), $R^{13}$ and $R^{14}$ represent a hydrogen atom; $R^{15}$ represents a hydrogen atom or a methyl group; each of $R^{16}$ to $R^{20}$ independently represents a hydrogen atom, an alkoxycarbonyl group, an alkyl group which may have a substituent, or an aryl group which may have a substituent; and $G^3$ is an alkyl group which may have a substituent.

6. A negative planographic printing plate precursor according to claim 1, wherein the polymer compound is included in the photosensitive composition in an amount of 20 to 80% by weight of a solid content.

7. A negative planographic printing plate precursor according to claim 1, wherein the polymer compound is included in the photosensitive composition in an amount of 40 to 70% by weight of a solid content.

8. A negative planographic printing plate precursor according to claim 1, wherein the image recording layer further includes a linear organic polymer which can be one of dissolved and swollen by one of water and a weak aqueous alkali.

9. A negative planographic printing plate precursor according to claim 1, wherein the radical generator is an onium salt.

* * * * *